(12) United States Patent
Choi et al.

(10) Patent No.: US 10,083,929 B2
(45) Date of Patent: Sep. 25, 2018

(54) FAN-OUT SEMICONDUCTOR PACKAGE

(71) Applicant: SAMSUNG ELECTRO-MECHANICS CO., LTD., Suwon-si, Gyeonggi-do (KR)

(72) Inventors: Seong Hee Choi, Suwon-si (KR); Han Kim, Suwon-si (KR); Dae Hyun Park, Suwon-si (KR); Mi Ja Han, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/666,073

(22) Filed: Aug. 1, 2017

(65) Prior Publication Data
US 2018/0174994 A1    Jun. 21, 2018

(30) Foreign Application Priority Data
Dec. 16, 2016 (KR) .................. 10-2016-0172790

(51) Int. Cl.
| | |
|---|---|
| *H01L 23/00* | (2006.01) |
| *H01L 23/538* | (2006.01) |
| *H01L 23/13* | (2006.01) |
| *H01L 21/56* | (2006.01) |

(Continued)

(52) U.S. Cl.
CPC .............. *H01L 24/20* (2013.01); *H01L 21/56* (2013.01); *H01L 21/76802* (2013.01); *H01L 23/13* (2013.01); *H01L 23/5389* (2013.01); *H01L 23/3128* (2013.01); *H01L 23/3142* (2013.01); *H01L 2924/19011* (2013.01); *H01L 2924/19042* (2013.01); *H01L 2924/3511* (2013.01)

(58) Field of Classification Search
CPC . H01L 23/13; H01L 23/3128; H01L 23/5389; H01L 23/645; H01L 24/20; H01L 21/76802; H01L 21/56
See application file for complete search history.

(56) References Cited

U.S. PATENT DOCUMENTS

| | | | |
|---|---|---|---|
| 9,853,003 B1 * | 12/2017 | Han | ........................ H01L 23/645 |
| 9,875,970 B2 * | 1/2018 | Yi | ........................ H01L 23/5389 |
| 2009/0096061 A1 | 4/2009 | Uchida | |

(Continued)

FOREIGN PATENT DOCUMENTS

| | | |
|---|---|---|
| JP | 2009-094359 A | 4/2009 |
| JP | 2012-174071 A | 9/2012 |

*Primary Examiner* — A. Sefer
(74) *Attorney, Agent, or Firm* — McDermott Will & Emery LLP

(57) ABSTRACT

A fan-out semiconductor package includes: a first connection member having a through-hole; a semiconductor chip disposed in the through-hole; an encapsulant encapsulating at least portions of the first connection member and the semiconductor chip; and a second connection member disposed on the first connection member and the semiconductor chip. The first connection member and the second connection member include, respectively, redistribution layers electrically connected to the connection pads of the semiconductor chip, the second connection member includes a coil pattern layer electrically connected to the connection pads of the semiconductor chip, and at least one of the first connection member and the second connection member includes a dummy pattern layer.

17 Claims, 13 Drawing Sheets

(51) Int. Cl.
  *H01L 21/768* (2006.01)
  *H01L 23/31* (2006.01)

(56) References Cited

U.S. PATENT DOCUMENTS

| | | | |
|---|---|---|---|
| 2017/0278766 A1* | 9/2017 | Kim | H01L 24/20 |
| 2017/0287853 A1* | 10/2017 | Kim | H01L 23/3114 |
| 2017/0373030 A1* | 12/2017 | Lee | H01L 24/06 |
| 2018/0053732 A1* | 2/2018 | Baek | H01L 23/552 |
| 2018/0090530 A1* | 3/2018 | Jeong | H01L 27/14618 |

* cited by examiner

FAN-OUT SEMICONDUCTOR PACKAGE

CROSS-REFERENCE TO RELATED APPLICATION(S)

This application claims the benefit of priority to Korean Patent Application No. 10-2016-0172790, filed on Dec. 16, 2016 in the Korean Intellectual Property Office, the disclosure of which is incorporated herein by reference in its entirety.

BACKGROUND

1. Field

The present disclosure relates to a semiconductor package, and more particularly, to a fan-out semiconductor package in which connection terminals may extend outwardly of a region in which a semiconductor chip is disposed.

2. Description of Related Art

Recently, a significant trend in the development of technology related to semiconductor chips has been to reduce the size of semiconductor chips. Therefore, in the field of package technology, in accordance with a rapid increase in demand for small-sized semiconductor chips, and the like, the implementation of a semiconductor package having a compact size, while including a plurality of pins, has been demanded.

One type of package technology suggested to satisfy the technical demand as described above is a fan-out semiconductor package. Such a fan-out semiconductor package has a compact size and may allow a plurality of pins to be implemented by redistributing connection terminals outwardly of a region in which a semiconductor chip is disposed.

SUMMARY

An aspect of the present disclosure may provide a fan-out semiconductor package having excellent power supplying efficiency, reduced cost, and excellent reliability.

According to an aspect of the present disclosure, a fan-out semiconductor package may be provided, in which a coil pattern layer and a dummy pattern layer are formed in a region in which a redistribution layer of the fan-out semiconductor package is formed.

According to an aspect of the present disclosure, a fan-out semiconductor package includes: a first connection member having a through-hole; a semiconductor chip disposed in the through-hole and having an active surface having connection pads disposed thereon and an inactive surface opposing the active surface; an encapsulant encapsulating at least portions of the first connection member and the inactive surface of the semiconductor chip; and a second connection member disposed on the first connection member and the active surface of the semiconductor chip. The first connection member and the second connection member include, respectively, redistribution layers electrically connected to the connection pads of the semiconductor chip, the second connection member includes a coil pattern layer electrically connected to the connection pads of the semiconductor chip, and at least one of the first connection member and the second connection member includes a dummy pattern layer.

According to another aspect of the present disclosure, a fan-out semiconductor package includes: a first connection member having a through-hole; a semiconductor chip disposed in the through-hole and having an active surface having connection pads disposed thereon and an inactive surface opposing the active surface; an encapsulant encapsulating at least portions of the first connection member and the inactive surface of the semiconductor chip; and a second connection member disposed on the first connection member and the active surface of the semiconductor chip, wherein the first connection member and the second connection member include, respectively, redistribution layers electrically connected to the connection pads of the semiconductor chip, the second connection member includes a coil pattern layer electrically connected to the connection pads of the semiconductor chip, and the second connection member includes a dummy pattern layer formed at a central portion of the coil pattern layer.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
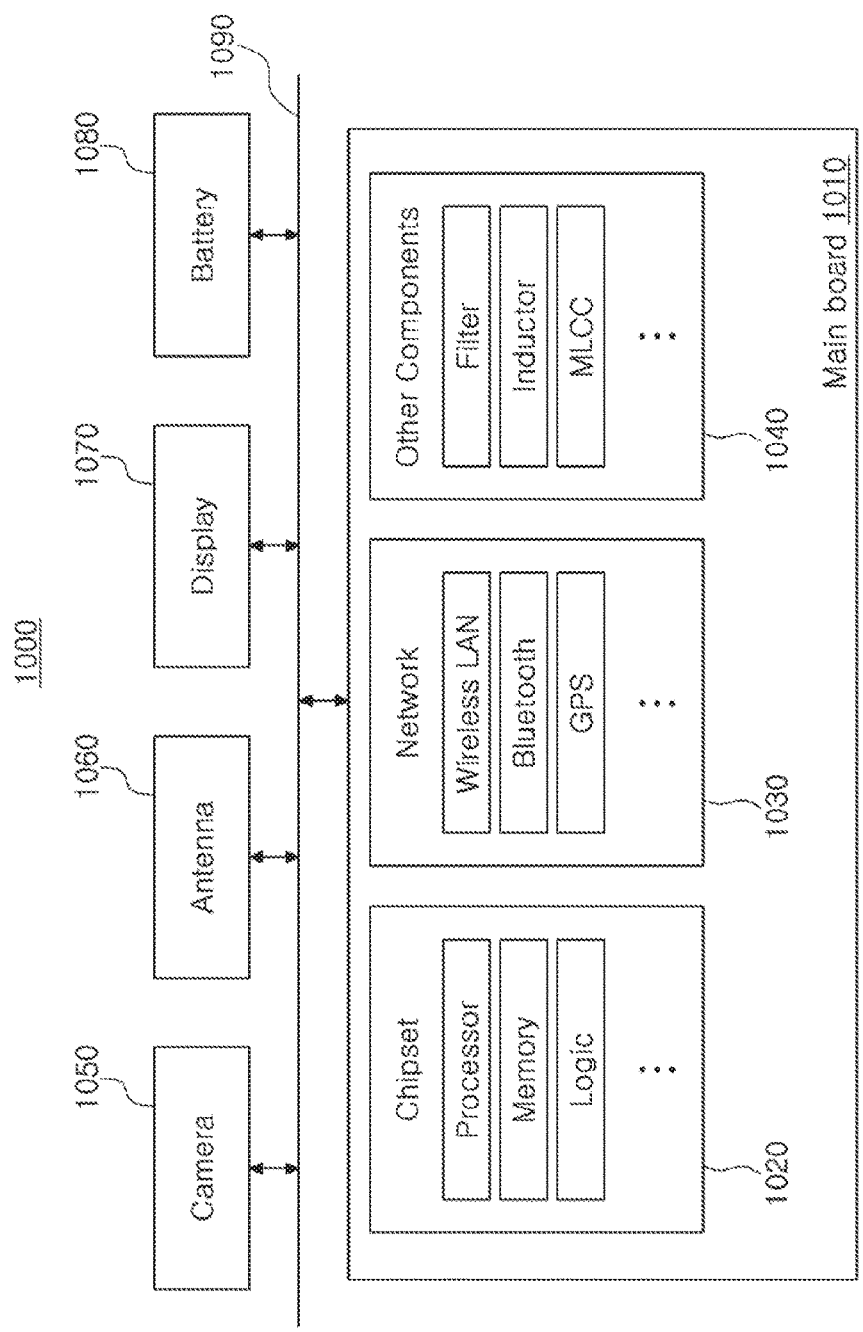
FIG. 1 is a schematic block diagram illustrating an example of an electronic device system.

Hereinafter, exemplary embodiments in the present disclosure will be described with reference to the accompanying drawings. In the accompanying drawings, shapes, sizes, and the like, of components may be exaggerated or omitted for clarity.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part with one another. For example, one element described in a particular exemplary embodiment, even if it is not described in another exemplary embodiment, may be understood as a description related to another exemplary embodiment, unless an opposite or contradictory description is provided therein.

The meaning of a "connection" of a component to another component in the description includes an indirect connection through a third component as well as a direct connection between two components. In addition, "electrically connected" encompasses the concepts of a physical connection and a physical disconnection. It can be understood that when an element is referred to using terms such as "first" and "second", the element is not limited thereby. They may only be usedonly be used for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

Herein, an upper portion, a lower portion, an upper side, a lower side, an upper surface, a lower surface, and the like, are decided in the attached drawings. For example, a first connection member is disposed on a level above a redistribution layer. However, the claims are not limited thereto. In addition, a vertical direction refers to the abovementioned upward and downward directions, and a horizontal direction refers to a direction perpendicular to the abovementioned upward and downward directions. In this case, a vertical cross section refers to a case taken along a plane in the vertical direction, and an example thereof may be a cross-sectional view illustrated in the drawings. In addition, a horizontal cross section refers to a case taken along a plane in the horizontal direction, and an example thereof may be a plan view illustrated in the drawings.

Terms used herein are used only in order to describe an exemplary embodiment rather than limiting the present disclosure. In this case, singular forms include plural forms unless interpreted otherwise in context.

Electronic Device

FIG. 1 is a schematic block diagram illustrating an example of an electronic device system.

Referring to FIG. 1, an electronic device 1000 may accommodate a main board 1010 therein. The main board 1010 may include chip-related components 1020, network-related components 1030, other components 1040, and the like, physically or electrically connected thereto. These components may be connected to others to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip-related components 1020 are not limited thereto, and may also include other types of chip-related components. In addition, the chip-related components 1020 may be combined with each other.

The network-related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, and may also include a variety of other wireless or wired standards or protocols. In addition, the network-related components 1030 may be combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip-related components 1020 or the network-related components 1030 described above.

Depending on a type of the electronic device 1000, the electronic device 1000 may include other components that may or may not be physically or electrically connected to the main board 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
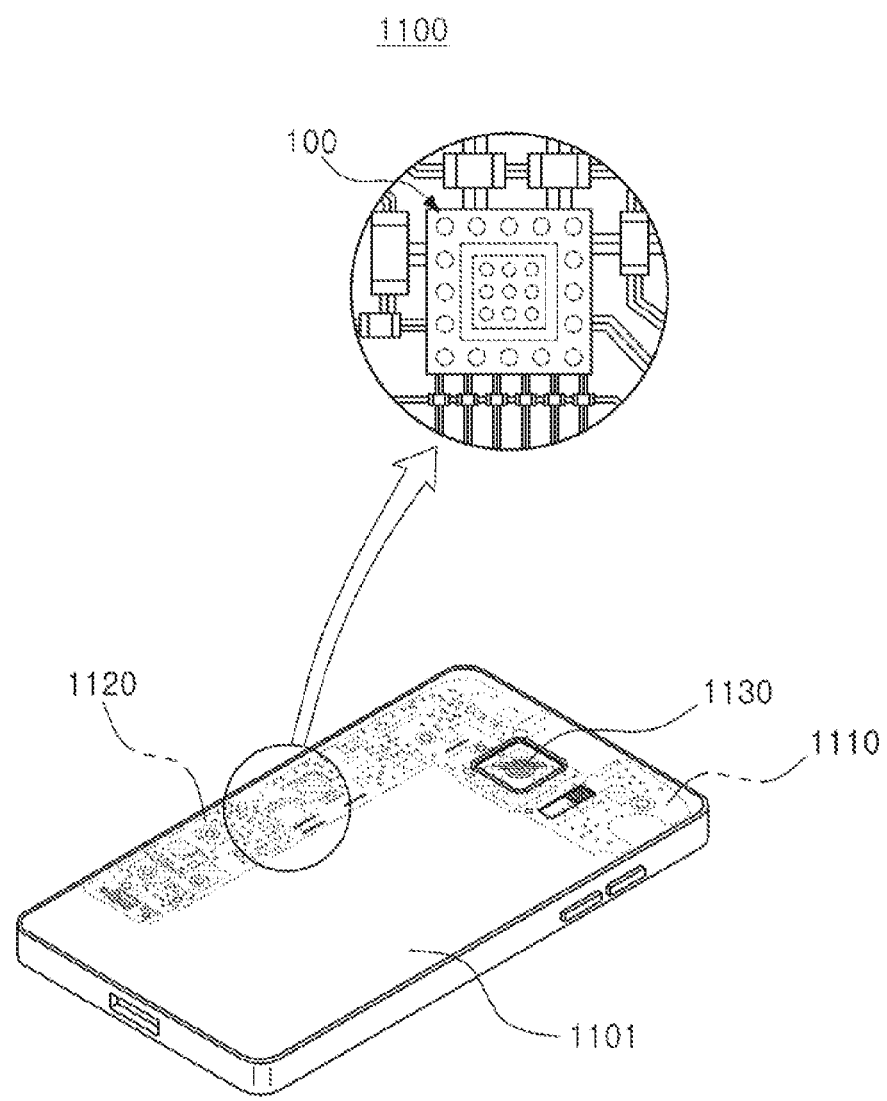
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a main board 1110 may be accommodated in a body 1101 of a smartphone 1100, and various electronic components 1120 may be physically or electrically connected to the main board 1110. In addition, other components that may or may not be physically or electrically connected to the main board 1110, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, and may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in circuit widths between the semiconductor chip and a main board of the electronic device in terms of electrical connections. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and packaging technology for buffering a difference in circuit widths between the semiconductor chip and the main board is required.

A semiconductor package manufactured using the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3B:
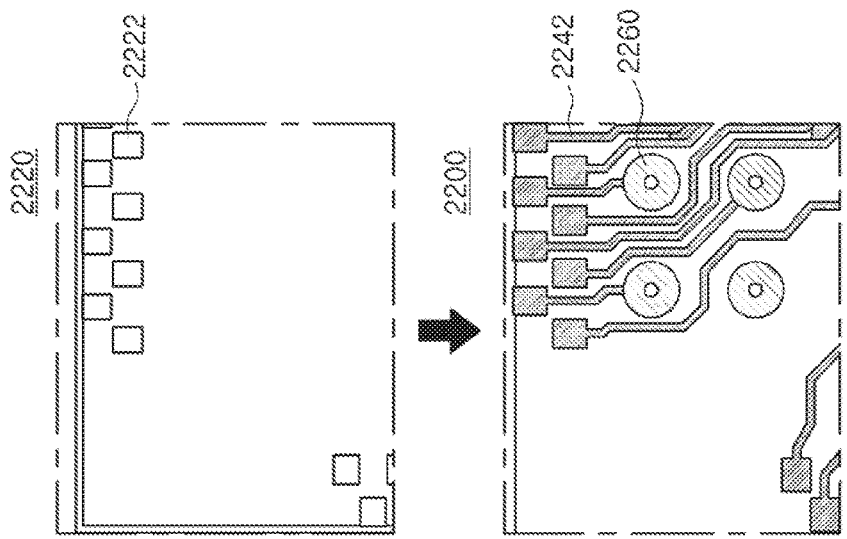
FIGS. 3A and 3B are schematic cross-sectional views illustrating states of a fan-in semiconductor package before and after being packaged.
Figure 3A:
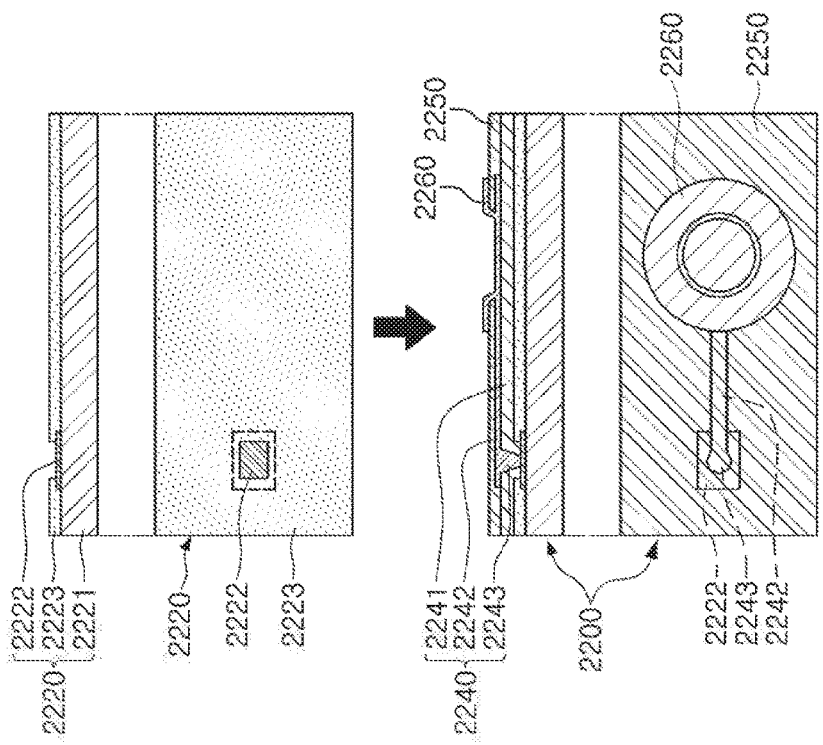

FIGS. 3A and 3B are schematic cross-sectional views illustrating states of a fan-in semiconductor package before and after being packaged.

Figure 4:
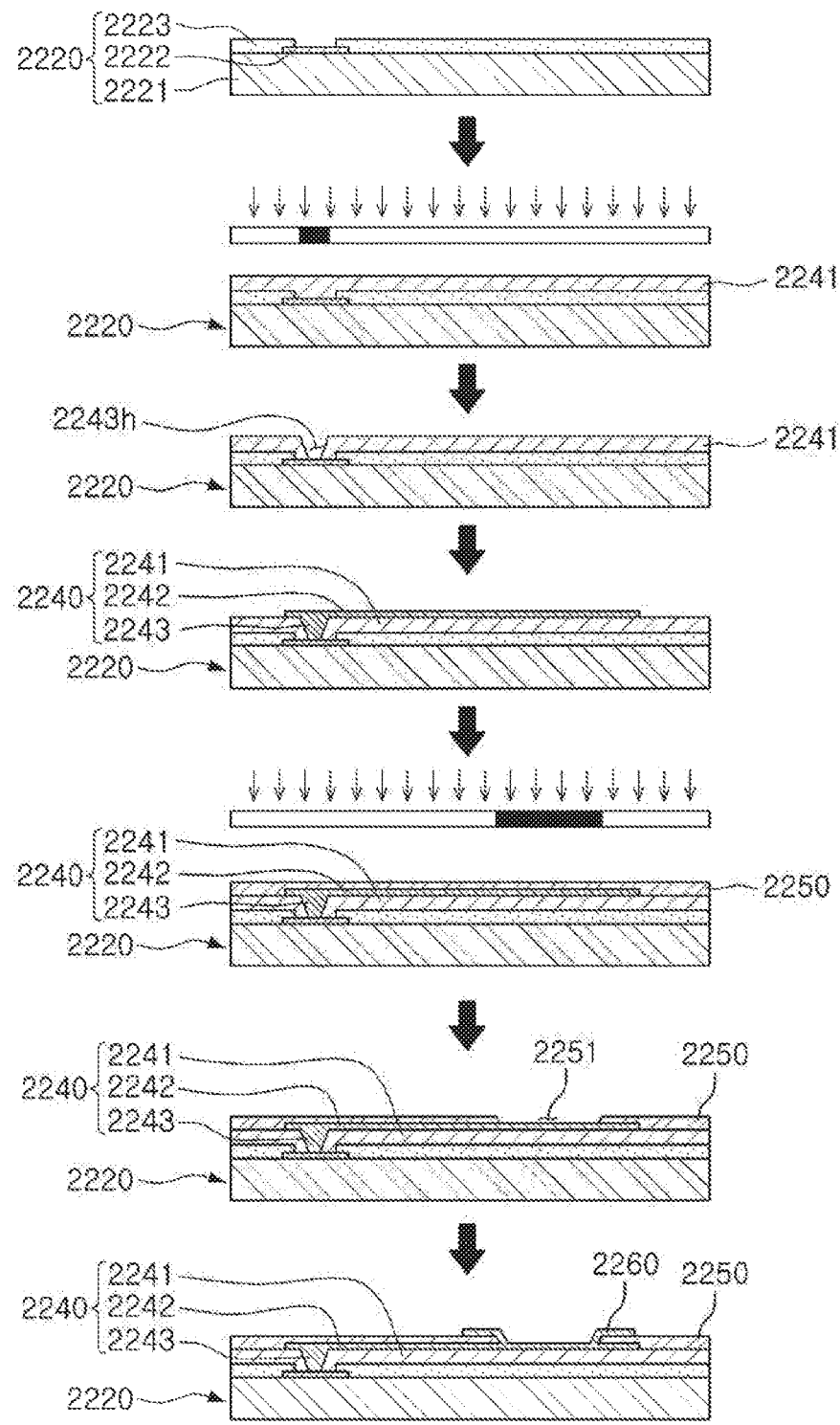
FIG. 4 is schematic cross-sectional views illustrating a packaging process of a fan-in semiconductor package.

FIG. 4 is schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it may be difficult to mount the integrated circuit (IC) on an intermediate level printed circuit board (PCB) as well as on the main board of the electronic device, or the like.

Therefore, a connection member 2240 may be formed on the semiconductor chip 2220, depending on a size of the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a significant spatial limitation. Therefore, it may be difficult to apply this structure to a semiconductor chip having a large number of I/O terminals or a semiconductor chip having a compact size. In addition, due to the disadvantages described above, the fan-in semiconductor package may not be directly mounted and used on the main board of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
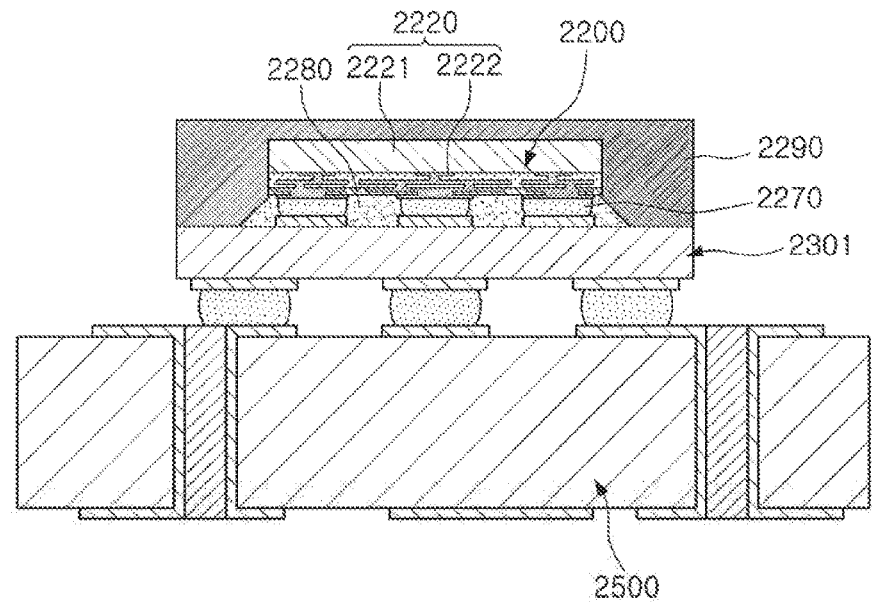
FIG. 5 is a schematic cross-sectional view illustrating a case in which a fan-in semiconductor package is mounted on an interposer substrate and is ultimately mounted on a main board of an electronic device.

FIG. 5 is a schematic cross-sectional view illustrating a case in which a fan-in semiconductor package is mounted on an interposer substrate and is ultimately mounted on a main board of an electronic device.

Figure 6:
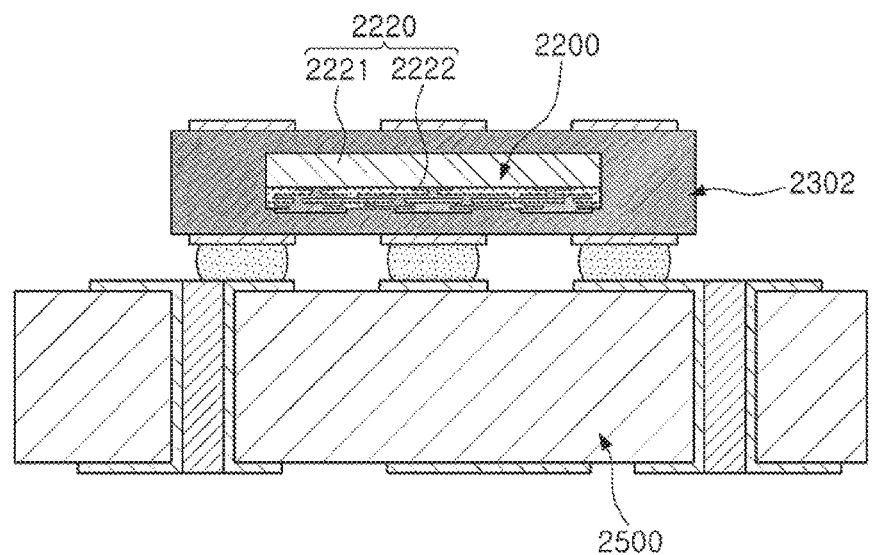
FIG. 6 is a schematic cross-sectional view illustrating a case in which a fan-in semiconductor package is embedded in an interposer substrate and is ultimately mounted on a main board of an electronic device.

FIG. 6 is a schematic cross-sectional view illustrating a case in which a fan-in semiconductor package is embedded in an interposer substrate and is ultimately mounted on a main board of an electronic device.

Referring to the drawings, in a fan-in semiconductor package 2200, connection pads 2222, that is, I/O terminals, of a semiconductor chip 2220 may be redistributed through an interposer substrate 2301, and the fan-in semiconductor package 2200 may be ultimately mounted on a main board 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

Fan-Out Semiconductor Package

Figure 7:
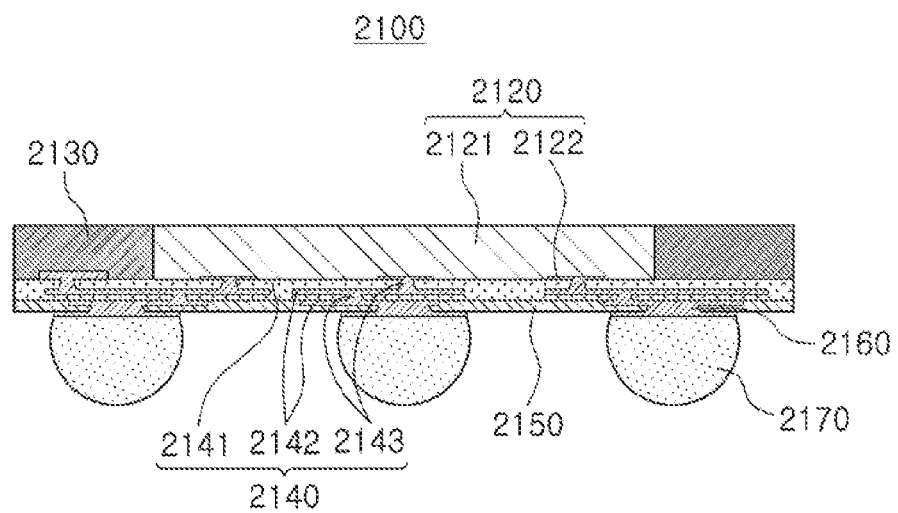
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
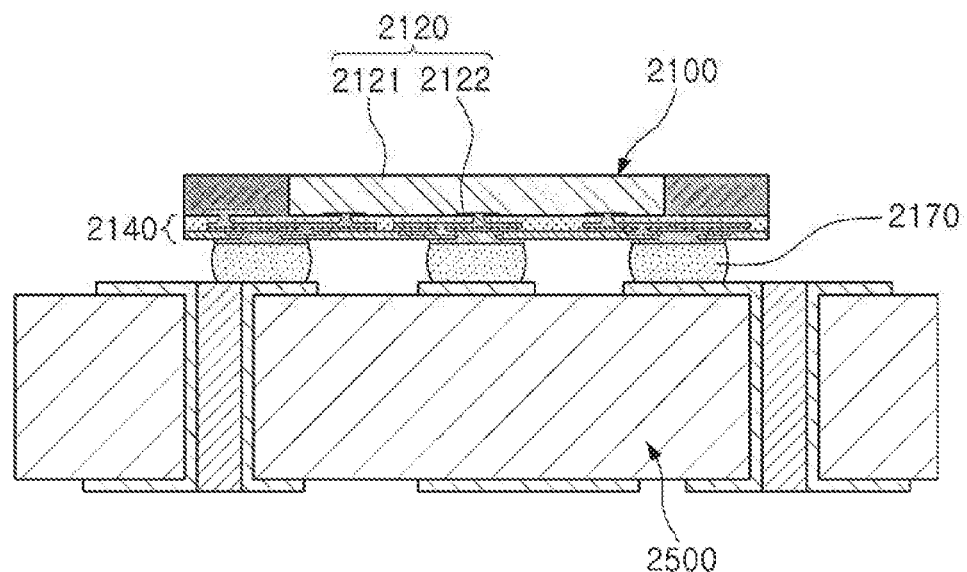
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile device. Therefore, the fan-out semiconductor package may be implemented in a form more compact than that of a general package-on-package (POP) type using a printed circuit board (PCB), and may solve a problem occurring due to occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

A fan-out semiconductor package in which power supplying efficiency is excellent, a cost may be reduced, and reliability is excellent will hereinafter be described with the drawings.

Figure 9:
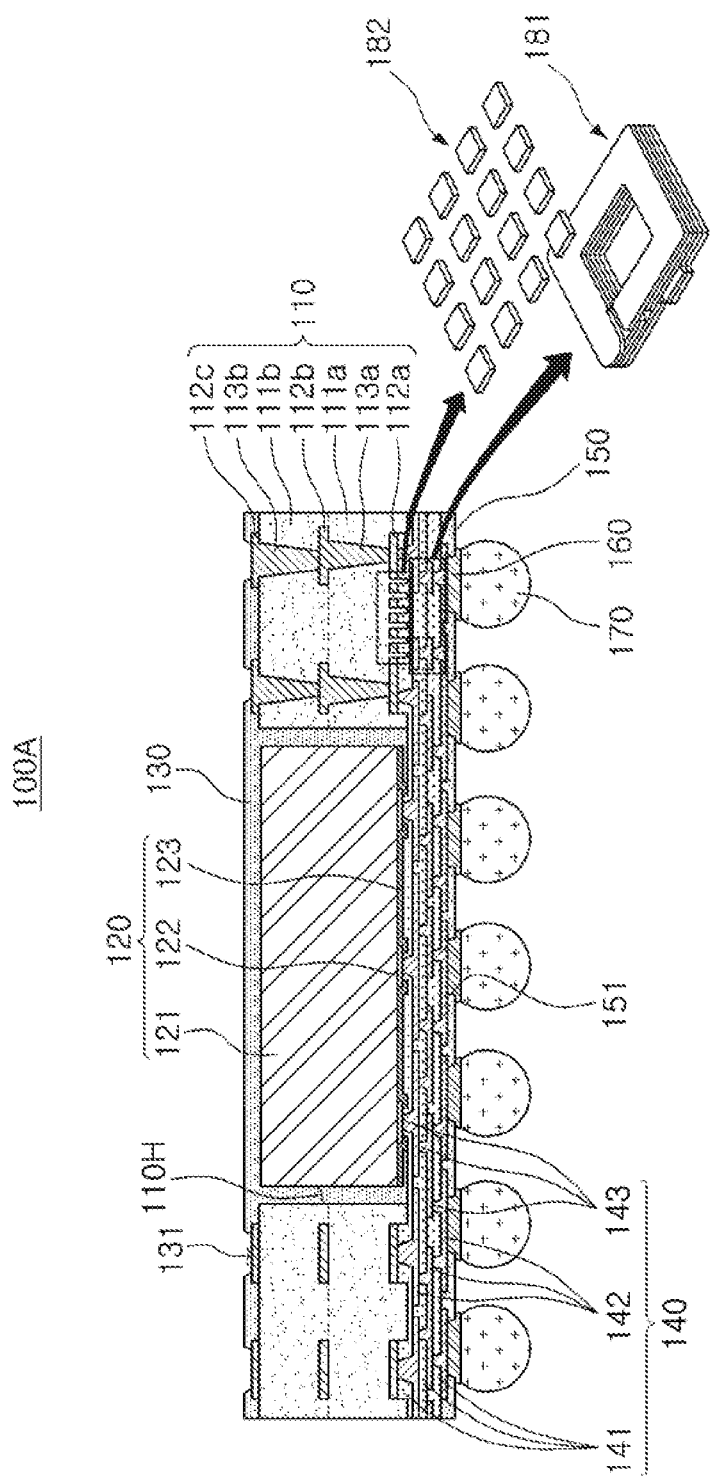
FIG. 9 is a schematic cross-sectional view illustrating an example of a fan-out semiconductor package.

FIG. 9 is a schematic cross-sectional view illustrating an example of a fan-out semiconductor package.

Referring to the drawings, a fan-out semiconductor package 100A according to an exemplary embodiment in the present disclosure may include a first connection member 110 having a through-hole 110H, a semiconductor chip 120 disposed in the through-hole 110H and having an active surface having connection pads 122 disposed thereon and an inactive surface opposing the active surface, an encapsulant 130 encapsulating at least portions of the first connection member 110 and the inactive surface of the semiconductor chip 120, and a second connection member 140 disposed on the first connection member 110 and the active surface of the semiconductor chip 120. The first connection member 110 may include redistribution layers 112a, 112b, and 112c electrically connected to the connection pads 122 of the semiconductor chip 120. The second connection member 140 may also include redistribution layers 142 electrically connected to the connection pads 122 of the semiconductor chip 120. The second connection member 140 may also include a coil pattern layer 181 electrically connected to the connection pads 122 of the semiconductor chip 120. The first connection member 110 may include a dummy pattern layer 182 formed above the coil pattern layers 181. The dummy pattern layer 182 may be formed directly above the coil pattern layer 181.

Recently, in accordance with an increase in a demand of high speed portable electronic devices, the necessity to smoothly supply power to a semiconductor package has increased. Therefore, a voltage regulator such as a direct current (DC)-DC converter, or the like, has been used in order to smoothly receive power supplied from a power supply, and various passive components have been connected to a power line from a main board of the electronic device to a semiconductor chip. For example, stabilization of power has been promoted by distributing power input from a battery, or the like, in a power management integrated circuit (PMIC) mounted on a main board and supplying the distributed power to the semiconductor package through a chip-type power inductor mounted on the main board.

However, in such a form, a path among the semiconductor package, the PMIC, and the chip-type power inductor is significantly large, such that power supplying efficiency is low. In addition, the chip-type power inductor that is separately manufactured and mounted on the main board of the electronic device or is embedded in the second connection member has a limitation in reducing a cost. In addition, the chip-type power inductor that is separately manufactured and mounted on the main board of the electronic device or is embedded in the second connection member has a limitation in implementing a quality (Q) factor due to a spatial limitation, or the like.

On the other hand, in the fan-out semiconductor package 100A according to the exemplary embodiment, the coil pattern layer 181 that may be used as a power inductor, or the like, may be formed in a specific region of the second connection member 140 in which the redistribution layers 142 redistributing the connection pads 122 of the semiconductor chip 120 are formed, and may be electrically connected to the connection pads 122 of the semiconductor chip 120 through the redistribution layers 142. Therefore, connection paths between the coil pattern layer 181 and the connection pads 122 may be very short. Resultantly, power supplying efficiency may be significantly improved. In addition, the power inductor, or the like, does not need to be manufactured and mounted in a separate chip form, and a cost may thus be reduced. In addition, space utilization is more excellent than that of the power inductor mounted in the separate chip form, such that a high Q factor may be implemented.

In addition, in the fan-out semiconductor package 100A according to the exemplary embodiment, the dummy pattern layer 182 disposed above the coil pattern layer 181 may be formed in the first connection member 110 to adjust a ratio of the metal in the first connection member 110 to the metal in the second connection member 140. Therefore, warpage due to mismatch between coefficients of thermal expansion (CTEs) may be controlled. In detail, when the coil pattern layer 181 is formed in a specific region of the second connection member 140, a metal ratio of the specific region may be lower than when the redistribution layer 142 is formed in the specific region. Resultantly, warpage due to a difference between the CTEs may occur. In this case, when the dummy pattern layer 182 is formed in the first connection member 110 to be disposed above the coil pattern layer 181, a metal ratio insufficient due to formation of the coil pattern layer 181 may be replenished. Resultantly, an entire mismatch between the CTEs may be avoided to suppress the warpage.

Particularly, in the fan-out semiconductor package 100A according to the exemplary embodiment, the dummy pattern layer 182 may be formed in the first connection member 110. That is, the number of layers of the second connection member 140 does not need to be increased in order to form the dummy pattern layer 182 above the coil pattern layer 181. Therefore, the dummy pattern layer 182 may be formed to improve reliability of the fan-out semiconductor package 100A, but the fan-out semiconductor package 100A may also be thinned. In addition, the dummy pattern layer 182 may be disposed in the first connection member 110 to significantly suppress deterioration of characteristics of the coil pattern layer 181 and increase a degree of freedom of a design of the redistribution layers 142 formed in the second connection member 140.

The respective components included in the fan-out semiconductor package 100A according to the exemplary embodiment will hereinafter be described in more detail.

The first connection member 110 may include the redistribution layers 112a, 112b, and 112c redistributing the connection pads 122 of the semiconductor chip 120 to thus reduce the number of layers of the second connection member 140. If necessary, the first connection member 110 may maintain rigidity of the fan-out semiconductor package 100A depending on certain materials, and serve to secure uniformity of a thickness of the encapsulant 130. In addition, due to the first connection member 110, the fan-out semiconductor package 100A according to the exemplary embodiment may be used as a portion of a package-on-package. The first connection member 110 may have the through-hole 110H. The semiconductor chip 120 may be disposed in the through-hole 110H to be spaced apart from the first connection member 110 by a predetermined distance. Side surfaces of the semiconductor chip 120 may be surrounded by the first connection member 110. However, such a form is only an example, and the through-hole 110H may be variously modified to have other forms, and the first connection member 110 may perform another function depending on such a form.

The first connection member 110 may include a first insulating layer 111a in contact with the second connection member 140, a first redistribution layer 112a in contact with the second connection member 140 and embedded in the first insulating layer 111a, a second redistribution layer 112b disposed on the other surface of the first insulating layer 111a opposing one surface of the first insulating layer 111a in which the first redistribution layer 112a is embedded, a second insulating layer 111b disposed on the first insulating layer 111a and covering the second redistribution layer 112b, and a third redistribution layer 112c disposed on the second insulating layer 111b. The first to third redistribution layers 112a, 112b, and 112c may be electrically connected to the connection pads 122. The first and second redistribution layers 112a and 112b and the second and third redistribution layers 112b and 112c may be electrically connected to each other by first and second vias 113a and 113b penetrating through the first and second insulating layers 111a and 111b, respectively.

Since the first redistribution layer 112a is embedded in the first insulating layer 111a, an insulating distance of an insulating layer 141 of the second connection member 140 may be substantially constant. Since the first connection member 110 may include a large number of redistribution layers 112a, 112b, and 112c, the second connection member 140 may be simplified. Therefore, a decrease in a yield after the semiconductor chip 120 is disposed due to a defect occurring in a process of forming the second connection member 140 may be suppressed. The first redistribution layer 112a may be recessed in the first insulating layer 111a, such that a lower surface of the first insulating layer 111a and a lower surface of the first redistribution layer 112a may have a step therebetween. Resultantly, when the encapsulant 130 is formed, a phenomenon in which a material of the encapsulant 130 bleeds to pollute the first redistribution layer 112a may be prevented.

Thicknesses of the redistribution layers 112a, 112b, and 112c of the first connection member 110 may be greater than that of the redistribution layers 142 of the second connection member 140. Since the first connection member 110 may have a thickness equal to or greater than that of the semiconductor chip 120, the redistribution layers 112a, 112b, and 112c may be formed at large sizes depending on a scale of the first connection member 110. On the other hand, the redistribution layers 142 of the second connection member 140 may be formed at relatively small sizes for thinness.

A material of each of the insulating layers 111a and 111b is not particularly limited. For example, an insulating material may be used as the material of each of the insulating layers. In this case, the insulating material may be a thermosetting resin such as an epoxy resin, a thermoplastic resin such as a polyimide resin, an insulating material in which the thermosetting resin or the thermoplastic resin is impregnated in an inorganic filler or a core material such as a glass fiber (or a glass cloth or a glass fabric), for example, prepreg, Ajinomoto Build up Film (ABF), FR-4, Bismaleimide Triazine (BT), or the like. Alternatively, a photoimagable dielectric (PID) resin may also be used as the material of each of the insulating layers 111a and 111b.

The redistribution layers 112a, 112b, and 112c may serve to redistribute the connection pads 122 of the semiconductor chip 120, and a material of each of the redistribution layers 112a, 112b, and 112c may be a conductive material such as copper (Cu), aluminum (Al), silver (Ag), tin (Sn), gold (Au), nickel (Ni), lead (Pb), titanium (Ti), or alloys thereof. The redistribution layers 112a, 112b, and 112c may perform various functions depending on designs of their corresponding layers. For example, the redistribution layers 112a, 112b, and 112c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 112a, 112b, and 112c may include various pad patterns, and the like.

The vias 113a and 113b may electrically connect the redistribution layers 112a, 112b, and 112c formed on different layers to each other, resulting in an electrical path in the first connection member 110. A material of each of the vias 113a and 113b may be a conductive material. Each of the vias 113a and 113b may be completely filled with the conductive material, or the conductive material may also be formed along a wall of each of via holes. In addition, each of the vias 113a and 113b may have all of the shapes known in the related art, such as a tapered shape, a cylindrical shape, and the like. Meanwhile, it may be advantageous in a process that each of the vias 113a and 113b has the tapered shape of which a width of an upper surface is greater than that of a lower surface.

The semiconductor chip 120 may be an integrated circuit (IC) provided in an amount of several hundreds to several millions of elements or more integrated in a single chip. The IC may be the known semiconductor chip, for example, an application processor (AP) such as a central processor (for example, a CPU), a graphic processor (for example, a GPU), a digital signal processor, a cryptographic processor, a micro processor, a micro controller, or the like. Alternatively, the IC may be a power management IC (PMIC). The AP and the PMIC, which are the semiconductor chip 120, may be disposed together with each other in the through-hole 110H of the first connection member 110. Alternatively, the AP and the PMIC may be integrated with each other as one chip and be disposed in the through-hole 110H of the first connection member 110. One end and the other end of a coil 180a such as a power inductor (PI) may be electrically connected to the AP and the PMIC, respectively. In detail, one end and the other end of the coil 180a such as the power inductor (PI) may be electrically connected to $V_{in}$ of the AP and $V_{out}$ of the PMIC, respectively.

The semiconductor chip 120 may include a body 121, the connection pads 122 formed on one surface of the body 121, and a passivation layer 123 formed on one surface of the body 121 and covering portions of the connection pads 122. The body 121 may be formed on the basis of, for example, an active wafer. In this case, a basic material of the body 121 may be silicon (Si), germanium (Ge), gallium arsenide (GaAs), or the like. The connection pads 122 may electrically connect the semiconductor chip 120 to other components, and a material of each of the connection pads 122 may be a conductive material such as aluminum (Al), or the like. The connection pads 122 may be redistributed by the second connection member 140, the first connection member 110, and the like. The active surface of the semiconductor chip 120 refers to a surface on which the connection pads 122 are formed, and the inactive surface of the semiconductor chip 120 refers to a surface opposing the active surface. The passivation layer 123 may serve to protect the body 121 from external impact, and may be, for example, an oxide film formed of SiO, etc., a nitride film formed of SiN, etc., or the like, or be a double layer of an oxide layer and a nitride layer. In addition, an insulating layer, or the like, formed of SiO, etc., may be further disposed between the body 121 and the connection pads 122 or between the body 121 and the passivation layer 123.

The encapsulant 130 may protect the first connection member 110 and the semiconductor chip 120. An encapsulation form of the encapsulant 130 is not particularly limited, but may be a form in which the encapsulant 130 surrounds at least portions of the first connection member 110 and the semiconductor chip 120. For example, the encapsulant 130 may cover at least portions of the first connection member 110 and the inactive surface of the semiconductor chip 120, and fill spaces between walls of the through-hole 110H and the side surfaces of the semiconductor chip 120. Meanwhile, the encapsulant 130 may fill the through-hole 110H to thus serve as an adhesive for fixing the semiconductor chip 120 and reduce buckling of the semiconductor chip 120 depending on certain materials.

The encapsulant 130 may include an insulating material. The insulating material may be a material including an inorganic filler and an insulating resin, for example, a thermosetting resin such as an epoxy resin, a thermoplastic resin such as a polyimide resin, a resin having a reinforcing material such as an inorganic filler impregnated in the thermosetting resin and the thermoplastic resin, such as ABF, FR-4, BT, a PID resin, or the like. In addition, the known molding material such as an epoxy molding compound (EMC), or the like, may also be used. Alternatively, a material in which a thermosetting resin or a thermoplastic resin is impregnated in an inorganic filler and/or a core material such as a glass fiber (or a glass cloth or a glass fabric) may also be used as the insulating material.

The encapsulant 130 may have openings 131 exposing at least portions of the redistribution layer 112c of the first connection member 110. A surface treatment layer may be formed on the exposed redistribution layer 112c. The surface treatment layer is not particularly limited as long as it is known in the related art, but may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like. The openings 131 may be filled by plating, if necessary. That is, a backside redistribution layer may be formed on the encapsulant 130, backside vias may be formed in the encapsulant 130, and the backside redistribution layer and the backside vias may be covered by a separate passivation layer, or the like. Openings exposing at least portions of the backside redistribution layer may be formed in the passivation layer.

The second connection member 140 may be configured to redistribute the connection pads 122 of the semiconductor chip 120. Several tens to several hundreds of connection pads 122 having various functions may be redistributed by the second connection member 140, and may be physically or electrically connected to an external source through connection terminals 170 to be described below depending on the functions. The second connection member 140 may include insulating layers 141, the redistribution layers 141 disposed on the insulating layers 142, and vias 143 penetrating through the insulating layers 141 and connecting the redistribution layers 142 to each other. The second connection member 140 may have a larger number or a smaller number of layers than the number of layers illustrated in the drawing.

A material of each of the insulating layers 141 may be an insulating material. In this case, a photosensitive insulating material such as a PID resin may also be used as the insulating material. That is, the insulating layer 141 may be a photosensitive insulating layer. When the insulating layer 141 has photosensitive properties, the insulating layer 141 may be formed to have a smaller thickness, and a fine pitch of the via 143 may be achieved more easily. The insulating layer 141 may be a photosensitive insulating layer including an insulating resin and an inorganic filler. When the insulating layers 141 are multiple layers, materials of the insulating layers 141 may be the same as each other, and may also be different from each other, if necessary. When the insulating layers 141 are the multiple layers, the insulating layers 141 may be integrated with each other depending on a process, such that a boundary therebetween may also not be apparent.

The redistribution layers 142 may serve to substantially redistribute the connection pads 122. A material of each of the redistribution layers 142 may be a conductive material such as copper (Cu), aluminum (Al), silver (Ag), tin (Sn), gold (Au), nickel (Ni), lead (Pb), titanium (Ti), or alloys thereof. The redistribution layers 142 may perform various functions depending on designs of their corresponding layers. For example, the redistribution layers 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 142 may include various pad patterns such as via pads, connection terminal pads, and the like.

The vias 143 may electrically connect the redistribution layers formed on different layers to each other, resulting in an electrical path in the fan-out semiconductor package 100A. A material of each of the vias 143 may be a conductive material such as copper (Cu), aluminum (Al), silver (Ag), tin (Sn), gold (Au), nickel (Ni), lead (Pb), titanium (Ti), or alloys thereof. Each of the vias 143 may be completely filled with the conductive material, or the conductive material may also be formed along a wall of each of the vias. In addition, each of the vias 143 may have all of the shapes known in the related art, such as a tapered shape, a cylindrical shape, and the like.

The coil pattern layer 181 may be formed in the second connection member 140, and may have various kinds of coil performances depending on a kind of semiconductor chip 120 included in the fan-out semiconductor package 100A. For example, the coil pattern layer may function as an inductor for a PMIC, function as an inductor for a filter, or function as an inductor for an AMP. The coil pattern layer 181 may be formed by pattern plating when the redistribution layer 142 is formed, and may be a single layer or be a plurality of layers. A shape of the coil pattern layer 181 is not particularly limited, but may be the pattern coil shape well-known in the related art. A material of the coil pattern layer 181 may be a conductive material such as copper (Cu), aluminum (Al), silver (Ag), tin (Sn), gold (Au), nickel (Ni), lead (Pb), titanium (Ti), or alloys thereof. The coil pattern layer 181 may be electrically connected to the connection pads 122 of the semiconductor chip 120 through the redistribution layers 142. In addition, the coil pattern layer 181 may also be electrically connected to an underbump metal layer 160 and connection terminals 170 through the redistribution layers 142.

The dummy pattern layer 182 may be formed in the first connection member 110, and may adjust a metal ratio due to the formation of the coil pattern layer 181. The reliability of the fan-out semiconductor package 100A may be improved through the dummy pattern layer 182. The dummy pattern layer 182 may be formed by pattern plating when the redistribution layer 112a is formed, and is illustrated as a single layer in the drawing, but may also be formed when the redistribution layers 112b and 112c are formed, such that the dummy pattern layer 182 may be a plurality of layers. A material of the dummy pattern layer 182 may be a conductive material such as copper (Cu), aluminum (Al), silver (Ag), tin (Sn), gold (Au), nickel (Ni), lead (Pb), titanium (Ti), or alloys thereof, and the dummy pattern layer 182 may be formed of the same material as that of the coil pattern layer 181. The dummy pattern layer 182 may be electrically insulated from the coil pattern layer 181. The dummy pattern layer 182 may be formed directly above or directly below the coil pattern layer 181 in order to more certainly suppress the mismatch between the CTEs. Here, "directly above or directly below" means directly above or directly below a region in which the coil pattern layer 181 is formed in the drawing.

A passivation layer 150 may be additionally configured to protect the second connection member 140 from external physical or chemical damage. The passivation layer 150 may have openings 151 exposing at least portions of the redistribution layer 142 of the second connection member 140. The number of openings formed in the passivation layer 150 may be several tens to several thousands.

A material of the passivation layer 150 is not particularly limited, but may be a photosensitive insulating material such as a PID resin. Alternatively, a solder resist may also be used as the material of the passivation layer 150. Alternatively, an insulating resin that does not include a core material, but includes a filler, for example, ABF including an inorganic filler and an epoxy resin may be used as the material of the passivation layer 150. When an insulating material that includes an inorganic filler and an insulating resin, but does not include a core material, for example, the ABF, or the like, is used as the material of the passivation layer 150, a passivation layer formed of a material similar to the insulating material may be formed on the encapsulant 130 to control warpage dispersion due to a symmetrical effect between the passivation layer formed on the encapsulant 130 and the passivation layer 150. When the insulating material including the inorganic filler and the insulating resin, such as the ABF, or the like, is used as the material of the passivation layer 150, the insulating layer 141 of the second connection member 140 may also include an inorganic filler and an insulating resin. In this case, a weight percent of the inorganic filler included in the passivation layer 150 may be greater than that of the inorganic filler included in the insulating layer 141 of the second connection member 140.

In this case, the passivation layer 150 may have a relatively low CTE, and may be utilized to control the warpage.

The underbump metal layer 160 may be additionally configured to improve connection reliability of the connection terminals 170 and improve board level reliability of the fan-out semiconductor package 100A. The underbump metal layer 160 may be connected to the redistribution layer 142 of the second connection member 140 opened through the openings 151 of the passivation layer 150. The underbump metal layer 160 may be formed in the openings 151 of the passivation layer 150 by the known metallization method using the known conductive metal such as a metal, but is not limited thereto.

The connection terminals 170 may be additionally configured to physically or electrically externally connect the fan-out semiconductor package 100A. For example, the fan-out semiconductor package 100A may be mounted on the main board of the electronic device through the connection terminals 170. Each of the connection terminals 170 may be formed of a conductive material, for example, a solder, or the like. However, this is only an example, and a material of each of the connection terminals 170 is not particularly limited thereto. Each of the connection terminals 170 may be a land, a ball, a pin, or the like. The connection terminals 170 may be formed as a multilayer or single layer structure. When the connection terminals 170 are formed as a multilayer structure, the connection terminals 170 may include a copper (Cu) pillar and a solder. When the connection terminals 170 are formed as a single layer structure, the connection terminals 170 may include a tin-silver solder or copper (Cu). However, this is only an example, and the connection terminals 170 are not limited thereto.

The number, an interval, a disposition, or the like, of the connection terminals 170 is not particularly limited, and may be sufficiently modified by a person skilled in the art depending on design particulars. For example, the connection terminals 170 may be provided in an amount of several tens to several thousands or may be provided in an amount of several tens to several thousands or more or several tens to several thousands or less. When the connection terminals 170 are solder balls, the connection terminals 170 may cover side surfaces of the underbump metal layer 160 extending onto one surface of the passivation layer 150, and connection reliability may be more excellent.

At least one of the connection terminals 170 may be disposed in a fan-out region. The fan-out region is a region except for a region in which the semiconductor chip 120 is disposed. That is, the fan-out semiconductor package 100A according to the exemplary embodiment may be a fan-out package. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be mounted on an electronic device without a separate board. Thus, the fan-out package may be manufactured to have a small thickness, and may have price competitiveness.

Although not illustrated in the drawings, a separate metal layer may be further disposed on an inner wall of the through-hole 110H of the first connection member 110, if necessary, in order to radiate heat and block an electromagnetic wave. In addition, if necessary, a plurality of semiconductor chips may be disposed in the through-hole 110H of the first connection member 110, and the number of through-holes 110H of the first connection member 110 may be plural and semiconductor chips may be disposed in the through-holes, respectively. In addition, separate passive components such as a capacitor, and the like, may be encapsulated together with the semiconductor chip in the through-hole 110H. In addition, a surface mount technology (SMT) component may be mounted on the passivation layer 150.

FIGS. 10A through 10E are schematic views illustrating various examples of a dummy pattern layer.

Figure 10A:
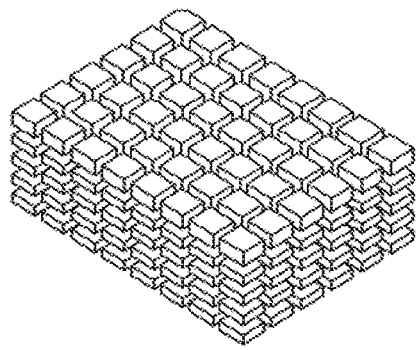
FIGS. 10A through 10E are schematic views illustrating various examples of a dummy pattern layer.
Figure 10B:
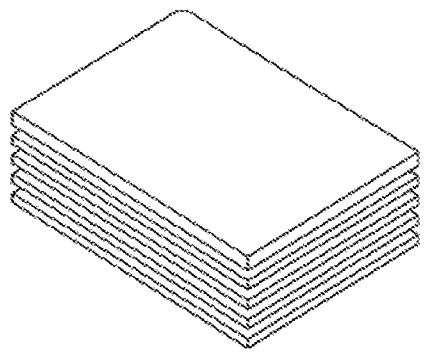
Figure 10C:
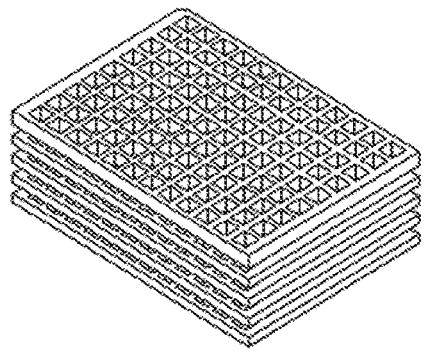
Figure 10D:
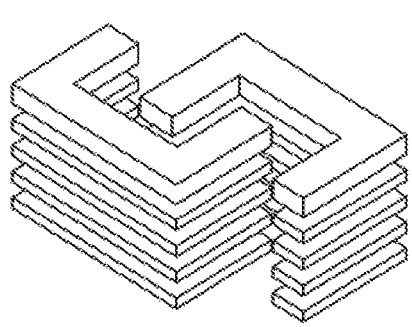
Figure 10E:
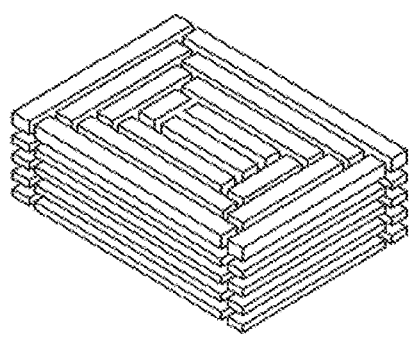

Referring to the drawings, the dummy pattern layer 182 may be formed of a plurality of dots spaced apart from each other as illustrated in FIG. 10A, may have a plate shape as illustrated in FIG. 10B, may have a hatch shape as illustrated in FIG. 10C, may have a mismatched ruggedness shape as illustrated in FIG. 10D, or may have a divided spiral shape as illustrated in FIG. 10E. That is, a shape or the number of layers of the dummy pattern layer 182 is not particularly limited as long as the dummy pattern layer 182 may adjust the metal ratio. When the dummy pattern layer 182 may be formed of the plurality of dots spaced apart from each other, hindrance to a flow of a magnetic flux of the coil pattern layer 181 may be less, and the metal ratio may be easily adjusted. However, the dummy pattern layer 182 is not limited to being formed of the plurality of dots spaced apart from each other.

Figure 11:
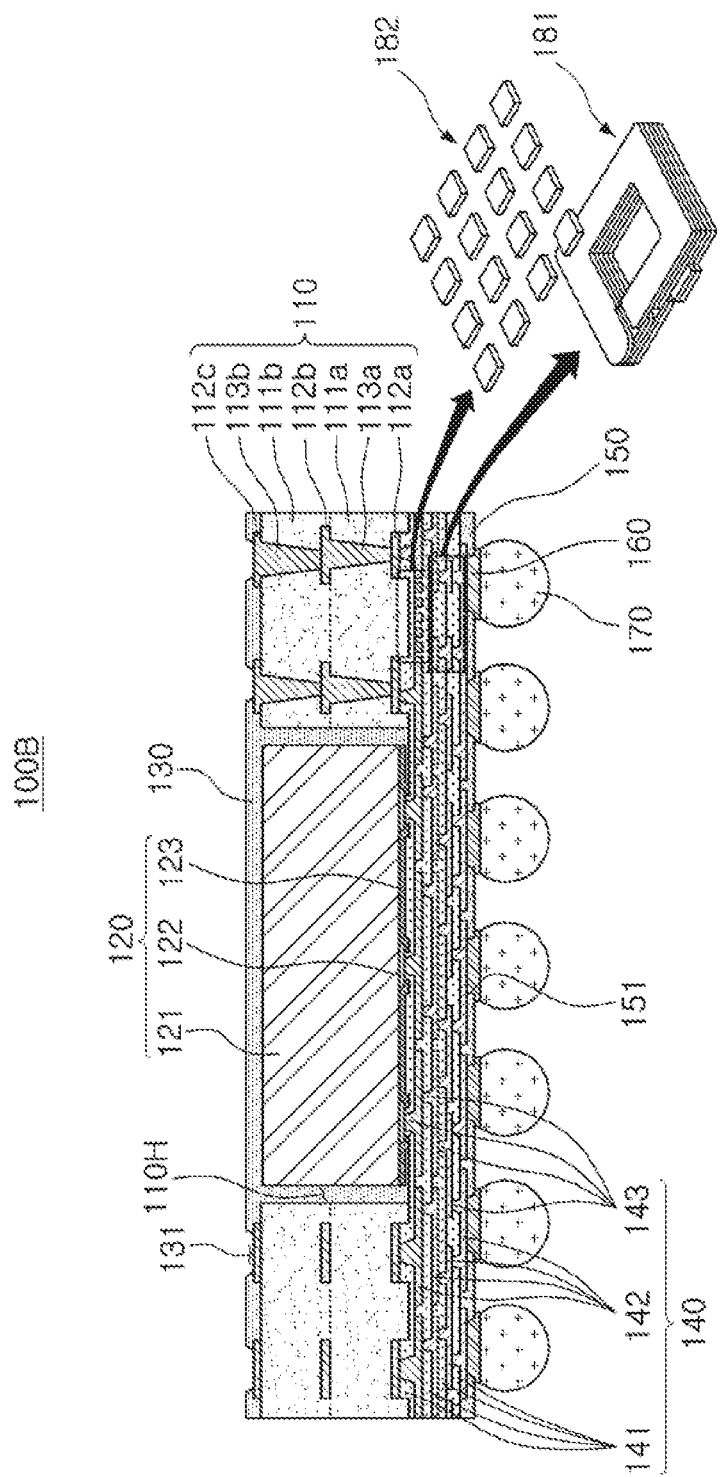
FIG. 11 is a schematic cross-sectional view illustrating another example of a fan-out semiconductor package.

FIG. 11 is a schematic cross-sectional view illustrating another example of a fan-out semiconductor package.

Referring to the drawing, in a fan-out semiconductor package 100B according to another exemplary embodiment in the present disclosure, a dummy pattern layer 182 may be formed above a coil pattern layer 181 in a second connection member 140. That is, the dummy pattern layer 182 may be formed directly above the coil pattern layer 181 in the second connection member 140. A description of a configuration overlapping that described above is omitted.

Figure 12:
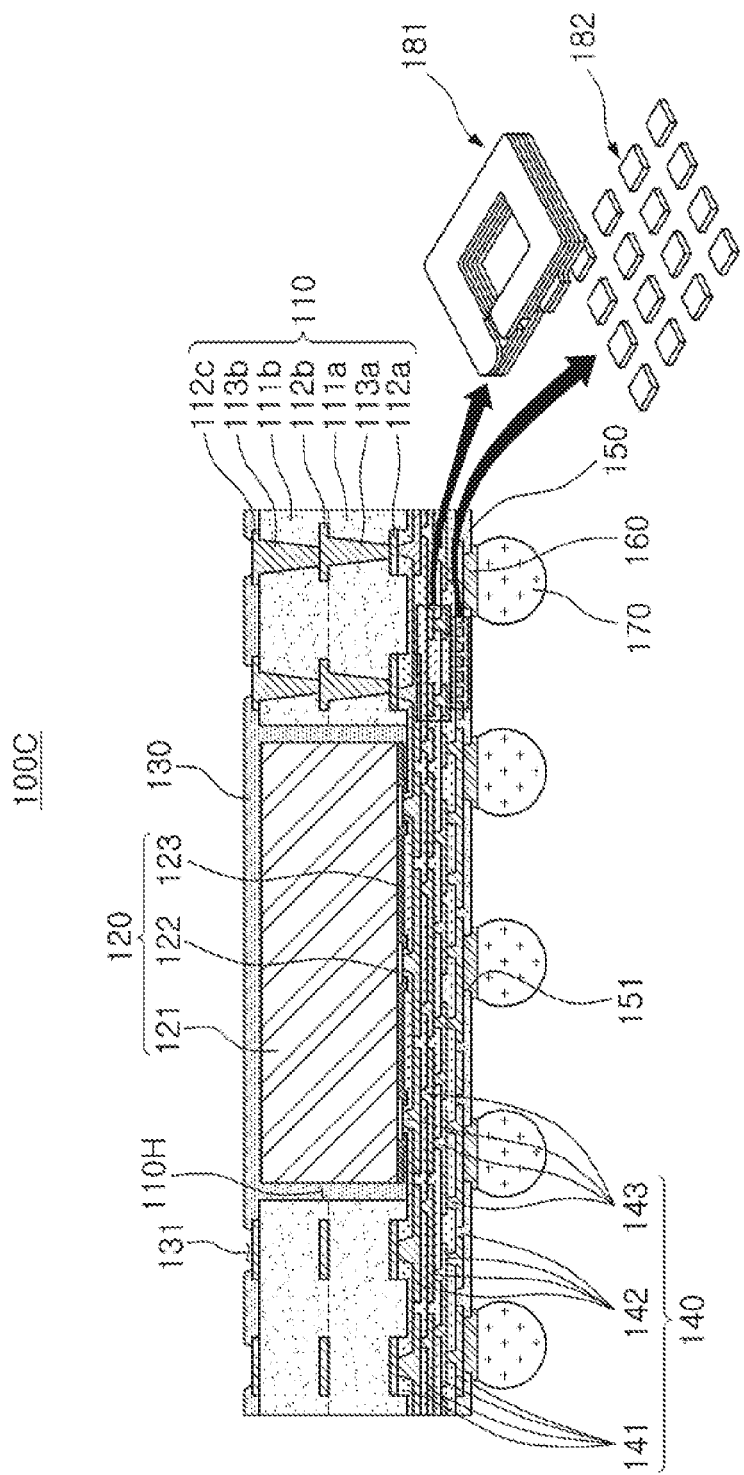
FIG. 12 is a schematic cross-sectional view illustrating another example of a fan-out semiconductor package.

FIG. 12 is a schematic cross-sectional view illustrating another example of a fan-out semiconductor package.

Referring to the drawing, in a fan-out semiconductor package 100C according to another exemplary embodiment in the present disclosure, a dummy pattern layer 182 may be formed below a coil pattern layer 181 in a second connection member 140. That is, the dummy pattern layer 182 may be formed directly below the coil pattern layer 181 in the second connection member 140. A description of a configuration overlapping that described above is omitted.

Figure 13:
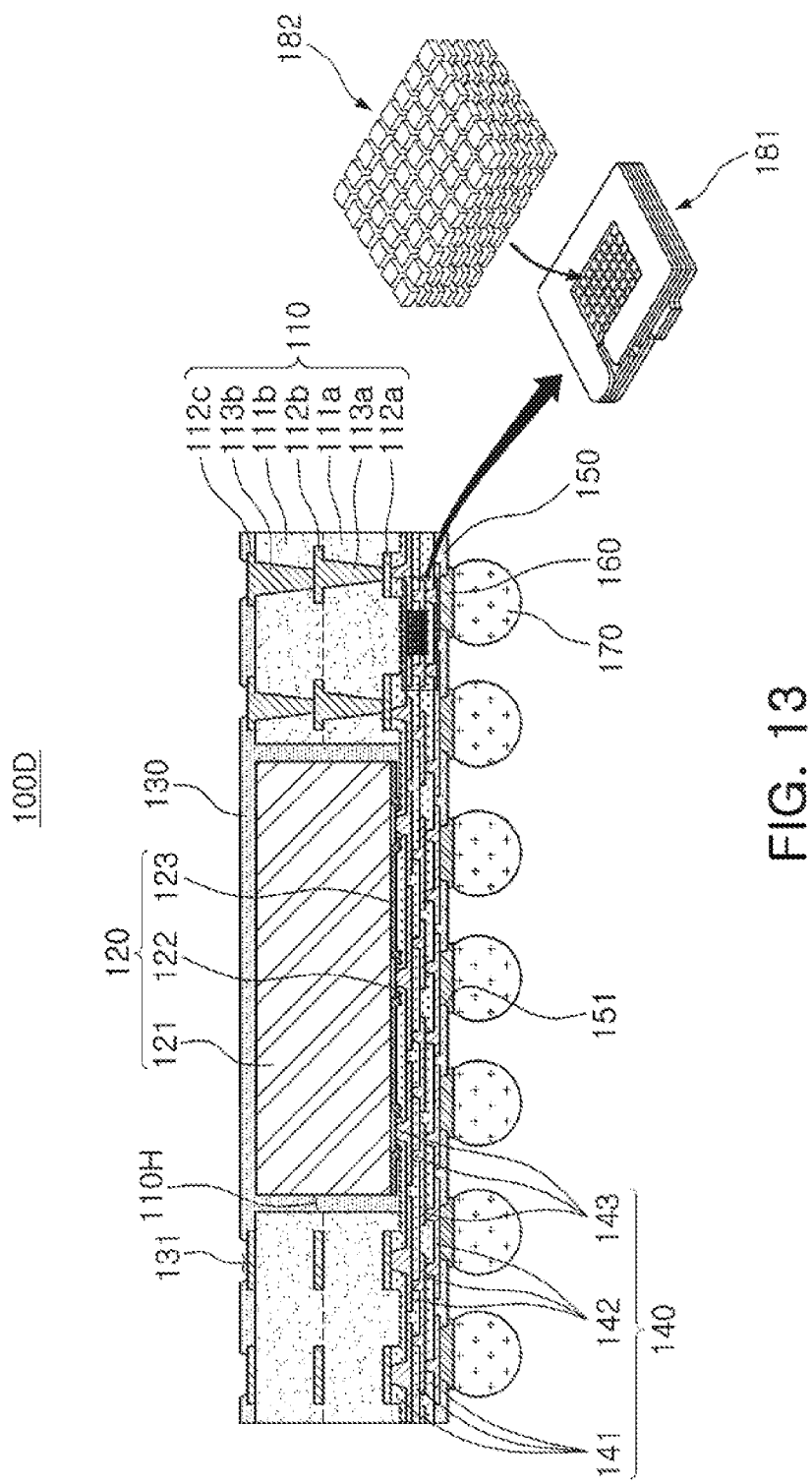
FIG. 13 is a schematic cross-sectional view illustrating another example of a fan-out semiconductor package.

FIG. 13 is a schematic cross-sectional view illustrating another example of a fan-out semiconductor package.

Referring to the drawing, in a fan-out semiconductor package 100D according to another exemplary embodiment in the present disclosure, a dummy pattern layer 182 may be formed at a central portion of a coil pattern layer 181 in a second connection member 140. That is, the dummy pattern layer 182 may be formed in a core region, which is the central portion of the coil pattern layer 181, when the coil pattern layer 181 in the second connection member 140 is formed. A description of a configuration overlapping that described above is omitted.

Figure 14:
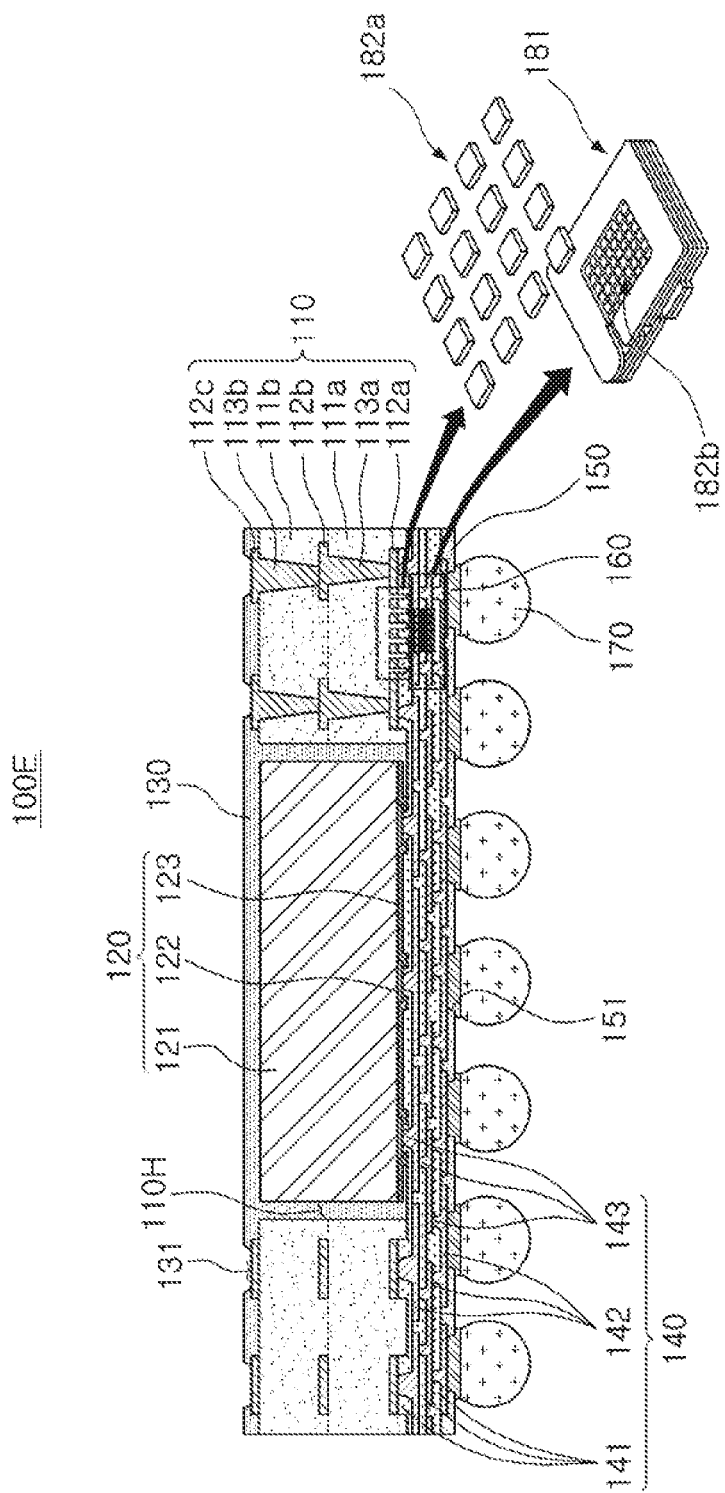
FIG. 14 is a schematic cross-sectional view illustrating another example of a fan-out semiconductor package.

FIG. 14 is a schematic cross-sectional view illustrating another example of a fan-out semiconductor package.

Referring to the drawing, in a fan-out semiconductor package 100E according to another exemplary embodiment in the present disclosure, a first dummy pattern layer 182a may be formed above a coil pattern layer 181 in a first connection member 110, and a second dummy pattern layer 182b may be formed at a central portion of the coil pattern layer 181 in a second connection member 140. That is, the fan-out semiconductor packages 100A and 100D described above may be combined with each other. Although not illustrated in the drawing, the features of the fan-out semiconductor packages 100B and 100C may also be combined with the features of the fan-out semiconductor package 100D. That is, the first dummy pattern layer 182a may be formed above or below the coil pattern layer 181 in the second connection member 140, and the second dummy pattern layer 182b may be formed at the central portion of the coil pattern layer 181 in the second connection member 140. A description of a configuration overlapping that described above is omitted.

Figure 15:
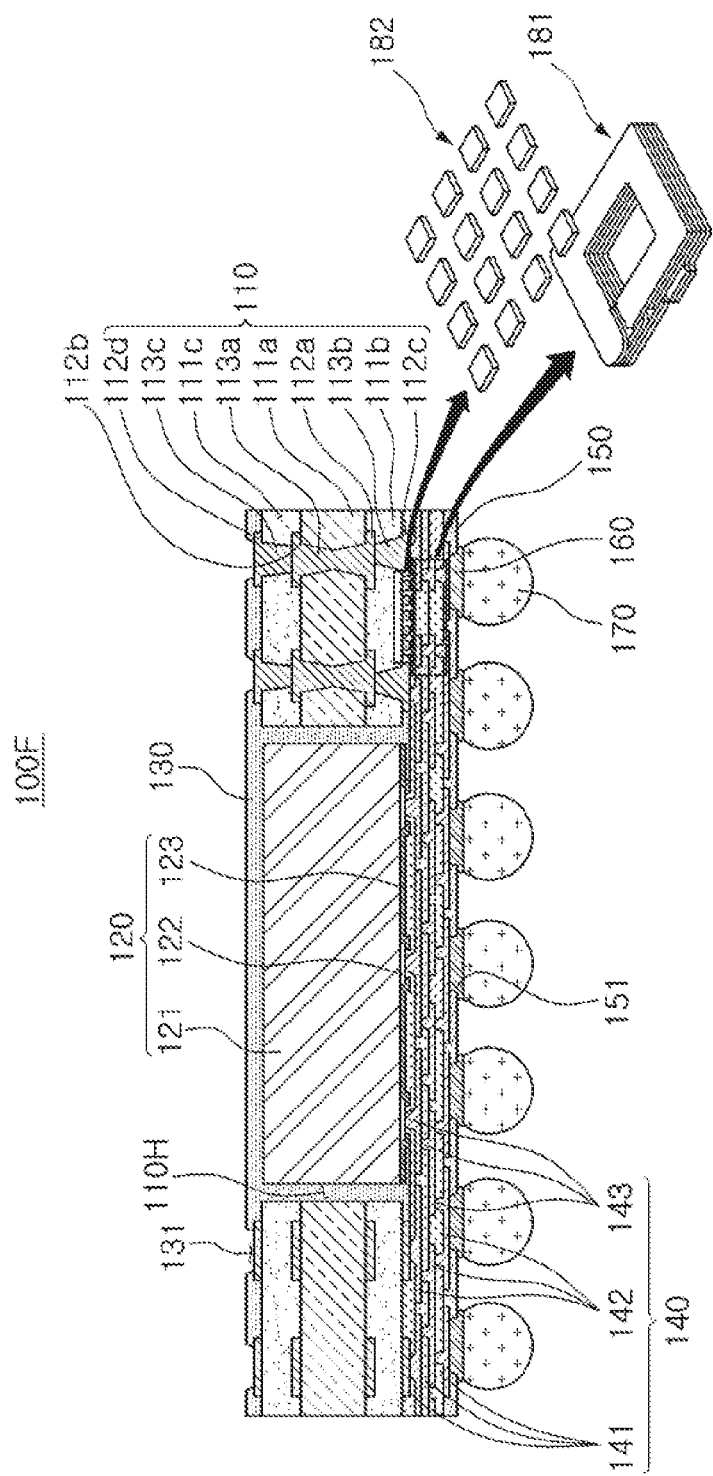
FIG. 15 is a schematic cross-sectional view illustrating another example of a fan-out semiconductor package

FIG. 15 is a schematic cross-sectional view illustrating another example of a fan-out semiconductor package.

Referring to the drawing, in a fan-out semiconductor package 100F according to another exemplary embodiment in the present disclosure, a first connection member 110 may include a first insulating layer 111a, a first redistribution layer 112a and a second redistribution layer 112b disposed on opposite surfaces of the first insulating layer 111a, respectively, a second insulating layer 111b disposed on the first insulating layer 111a and covering the first redistribution layer 112a, a third redistribution layer 112c disposed on the second insulating layer 111b, a third insulating layer 111c disposed on the first insulating layer 111a and covering the second redistribution layer 112b, and a fourth redistribution layer 112d disposed on the third insulating layer 111c. Since the first connection member 110 may include a larger number of redistribution layers 112a, 112b, 112c, and 112d, a second connection member 140 may be further simplified. The first to fourth redistribution layers 112a, 112b, 112c, and 112d may be electrically connected to each other by first to third vias 113a, 113b, and 113c each penetrating through the first to third insulating layers 111a, 111b, and 111c.

The first insulating layer 111a may have a thickness greater than those of the second insulating layer 111b and the third insulating layer 111c. The first insulating layer 111a may be basically relatively thick in order to maintain rigidity, and the second insulating layer 111b and the third insulating layer 111c may be introduced in order to form a larger number of redistribution layers 112c and 112d. The first insulating layer 111a may include an insulating material different from those of the second insulating layer 111b and the third insulating layer 111c. For example, the first insulating layer 111a may be, for example, prepreg including a core material, an inorganic filler, and an insulating resin, and the second insulating layer 111b and the third insulating layer 111c may be an ABF or a photosensitive insulating film including an inorganic filler and an insulating resin. However, the materials of the first insulating layer 111a and the second and third insulating layers 111b and 111c are not limited thereto. Similarly, the first via 113a may have a diameter greater than those of the second via 113b and the third via 113c.

Thicknesses of the redistribution layers 112a, 112b, 112c, and 112d of the first connection member 110 may be greater that those of redistribution layers 142 of the second connection member 140. Since the first connection member 110 may have a thickness equal to or greater than that of the semiconductor chip 120, the redistribution layers 112a, 112b, 112c, and 112d may also be formed to have large sizes. On the other hand, the redistribution layers 142 of the second connection member 140 may be formed at relatively small sizes for thinness.

A description of a configuration overlapping that described above is omitted. Although not illustrated in the drawing, the features of the fan-out semiconductor packages 100B to 100E described above may also be appropriately introduced into the structure of the fan-out semiconductor package 100F described above.

As set forth above, according to the exemplary embodiment in the present disclosure, a fan-out semiconductor package in which power supplying efficiency is excellent, a cost may be reduced, and reliability is excellent may be provided.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
a first connection member having a through-hole;
a semiconductor chip disposed in the through-hole and having an active surface having connection pads disposed thereon and an inactive surface opposing the active surface;
an encapsulant encapsulating at least portions of the first connection member and the inactive surface of the semiconductor chip; and
a second connection member disposed on the first connection member and the active surface of the semiconductor chip,
wherein the first connection member and the second connection member include, respectively, redistribution layers electrically connected to the connection pads of the semiconductor chip,
the second connection member includes a coil pattern layer electrically connected to the connection pads of the semiconductor chip, and
at least one of the first connection member and the second connection member includes a first dummy pattern layer.

2. The fan-out semiconductor package of claim 1, wherein the first dummy pattern layer is disposed above or below the coil pattern layer.

3. The fan-out semiconductor package of claim 1, wherein at least a portion of the first dummy pattern layer is formed in the first connection member.

4. The fan-out semiconductor package of claim 2, wherein the first dummy pattern layer is formed directly above or directly below the coil pattern layer.

5. The fan-out semiconductor package of claim 1, wherein the first dummy pattern layer is electrically insulated from the coil pattern layer.

6. The fan-out semiconductor package of claim 1, wherein the second connection member includes a second dummy pattern layer formed at a central portion of the coil pattern layer.

7. The fan-out semiconductor package of claim 6, wherein the second dummy pattern layer is electrically insulated from the coil pattern layer.

8. The fan-out semiconductor package of claim 1, wherein the coil pattern layer is formed in only a specific region of the first connection member.

9. The fan-out semiconductor package of claim 1, wherein the first connection member includes a first insulating layer, a first redistribution layer in contact with the second connection member and embedded in a first surface of the first insulating layer, and a second redistribution layer disposed on a second surface of the first insulating layer opposing the first surface of the first insulating layer.

10. The fan-out semiconductor package of claim 9, wherein the first connection member further includes a second insulating layer disposed on the first insulating layer and covering the second redistribution layer and a third redistribution layer disposed on the second insulating layer.

11. The fan-out semiconductor package of claim 9, wherein a lower surface of the first redistribution layer has a step with respect to a lower surface of the first insulating layer.

12. The fan-out semiconductor package of claim 1, wherein the first connection member includes a first insulating layer, a first redistribution layer and a second redistribution layer disposed on opposite surfaces of the first insulating layer, respectively, a second insulating layer disposed on the first insulating layer and covering the first redistribution layer, and a third redistribution layer disposed on the second insulating layer.

13. The fan-out semiconductor package of claim 12, wherein the first connection member further includes a third insulating layer disposed on the first insulating layer and covering the second redistribution layer and a fourth redistribution layer disposed on the third insulating layer.

14. The fan-out semiconductor package of claim 12, wherein the first insulating layer has a thickness greater than that of the second insulating layer.

15. A fan-out semiconductor package comprising:
a first connection member having a through-hole;
a semiconductor chip disposed in the through-hole and having an active surface having connection pads disposed thereon and an inactive surface opposing the active surface;
an encapsulant encapsulating at least portions of the first connection member and the inactive surface of the semiconductor chip; and
a second connection member disposed on the first connection member and the active surface of the semiconductor chip,
wherein the first connection member and the second connection member include, respectively, redistribution layers electrically connected to the connection pads of the semiconductor chip, and
the second connection member includes a coil pattern layer electrically connected to the connection pads of the semiconductor chip and a first dummy pattern layer formed at a central portion of the coil pattern layer.

16. The fan-out semiconductor package of claim 15, wherein at least one of the first connection member and the second connection member includes a second dummy pattern layer formed above or below the coil pattern layer.

17. The fan-out semiconductor package of claim 16, wherein at least a portion of the second dummy pattern layer is formed in the first connection member.

\* \* \* \* \*